United States Patent
Yeh et al.

(10) Patent No.: US 7,729,124 B2
(45) Date of Patent: Jun. 1, 2010

(54) MOUNTING APPARATUS FOR HEAT SINK

(75) Inventors: Chin-Wen Yeh, Taipei Hsien (TW); Zhen-Neng Lin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/352,884

(22) Filed: Jan. 13, 2009

(65) Prior Publication Data

US 2010/0085714 A1    Apr. 8, 2010

(30) Foreign Application Priority Data

Oct. 6, 2008    (CN)    ........................ 2008 2 0302339

(51) Int. Cl.
*H05K 7/20* (2006.01)
*G06F 1/20* (2006.01)

(52) U.S. Cl. .................. 361/719; 361/679.54; 361/704; 361/709; 361/710; 165/80.2; 165/185; 24/458; 248/510

(58) Field of Classification Search ............ 361/679.54, 361/704, 709–710, 719; 165/80.2–80.3; 165/185; 174/16.3; 24/297, 453, 457–458; 248/505, 510

See application file for complete search history.

(56) References Cited

U.S. PATENT DOCUMENTS

| | | | | | |
|---|---|---|---|---|---|
| 6,055,159 | A | * | 4/2000 | Sun | 361/704 |
| 6,210,068 | B1 | * | 4/2001 | Wei | 403/353 |
| 7,144,762 | B2 | * | 12/2006 | So | 438/122 |
| 7,190,586 | B2 | * | 3/2007 | Franz et al. | 361/704 |
| 7,333,338 | B2 | * | 2/2008 | Lai et al. | 361/715 |
| 7,342,795 | B2 | * | 3/2008 | Lee et al. | 361/719 |
| 7,440,284 | B1 | * | 10/2008 | Lin | 361/719 |
| 7,518,875 | B2 | * | 4/2009 | Desrosiers et al. | 361/719 |
| 7,609,522 | B2 | * | 10/2009 | Jin et al. | 361/710 |
| 2009/0185351 | A1 | * | 7/2009 | Li et al. | 361/719 |

\* cited by examiner

*Primary Examiner*—Jayprakash N Gandhi
*Assistant Examiner*—Robert J Hoffberg
(74) *Attorney, Agent, or Firm*—Clifford O. Chi

(57) ABSTRACT

A mounting apparatus includes a heat sink with two first mounting holes receiving two screws respectively, and a printed circuit board (PCB) with a second mounting hole, and a third mounting hole corresponding to the first mounting holes. The second mounting hole includes a second inserting hole, and a second accommodating hole extending from the second inserting hole along a first axis. The third mounting hole includes a third inserting hole, and a third accommodating hole extending from the third inserting hole along a second axis. One screw is inserted into the second inserting hole, and moved along a first axis to be received in the second accommodating hole. Another screw is angled into the third inserting hole, released to return to an upright position and received in the third accommodating hole.

7 Claims, 4 Drawing Sheets

MOUNTING APPARATUS FOR HEAT SINK

BACKGROUND

1. Technical Field

The present disclosure relates to an apparatus for mounting a heat sink to a printed circuit board (PCB).

2. Description of Related Art

A heat sink is often mounted to a PCB via screws into screw holes on the PCB. With this mounting mechanism, an additional tool is needed to attach the screws, causing inconvenience and consuming considerable time in a factory assembly line.

Therefore, an apparatus for mounting a heat sink to a PCB is desired which addresses the described limitations.

DETAILED DESCRIPTION OF THE EMBODIMENTS

Figure 1:
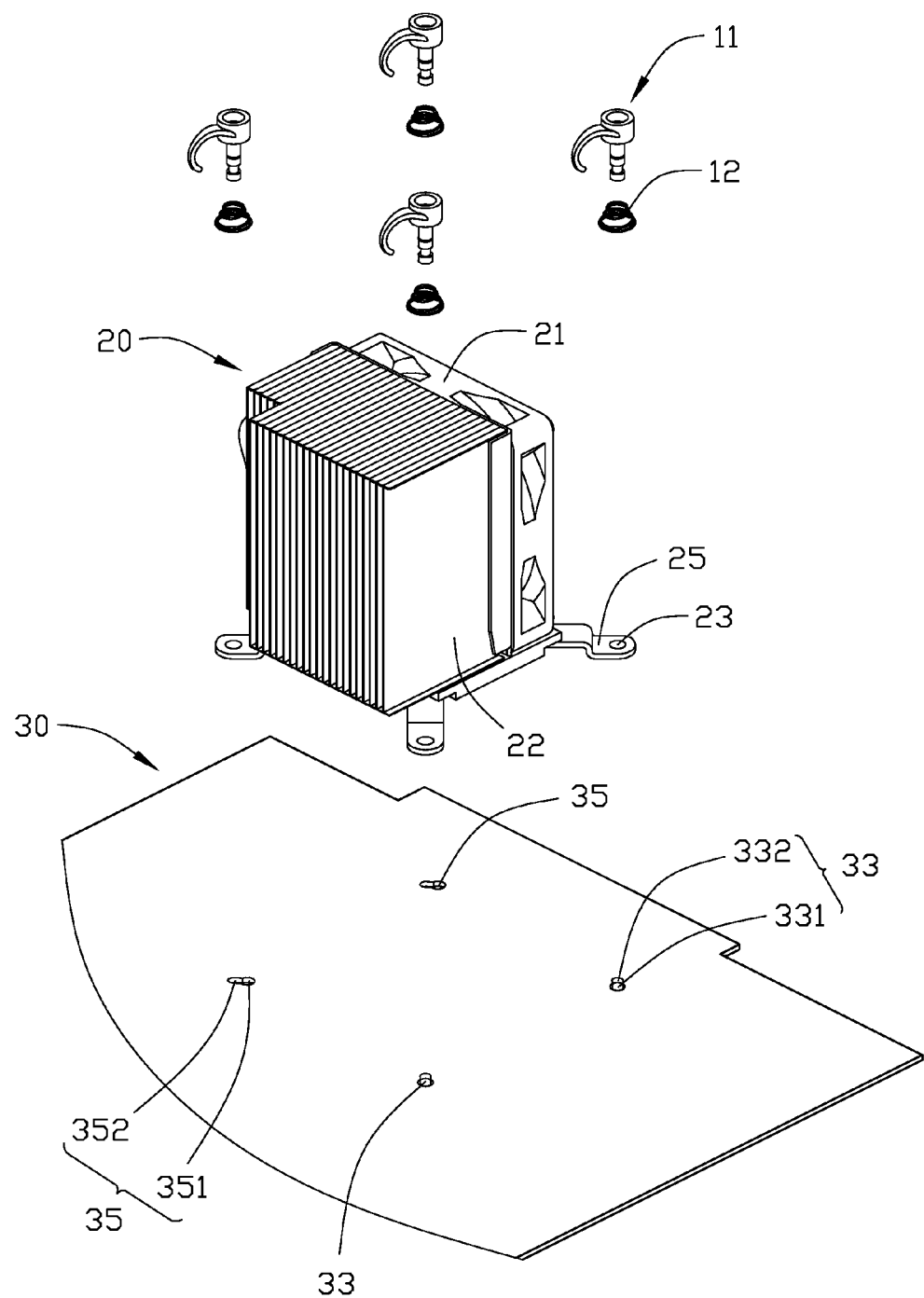
FIG. 1 is an exploded view of an embodiment of a mounting apparatus, associated with a heat sink, and a PCB.
Figure 2:
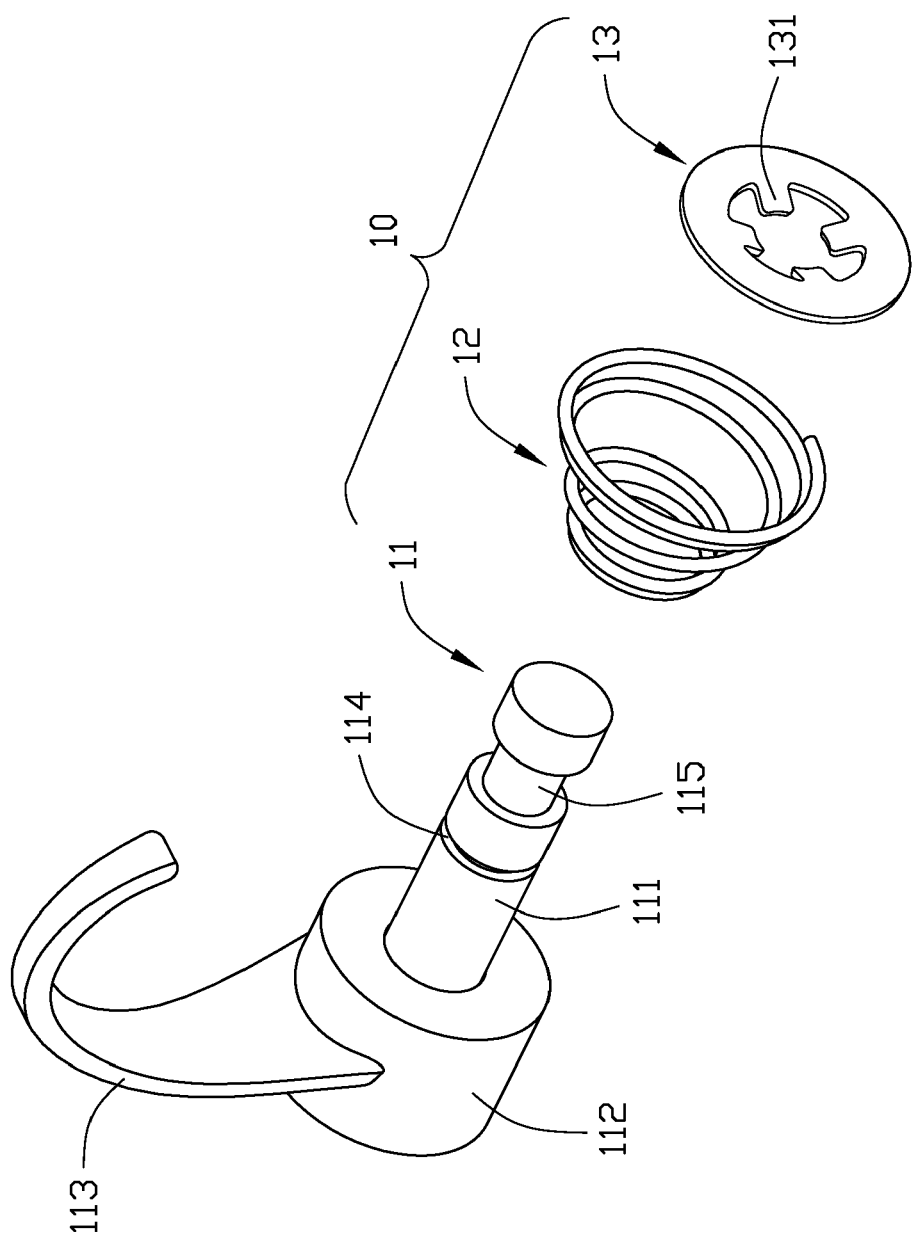
FIG. 2 is an exploded view of the mounting apparatus of FIG. 1.

Referring to FIGS. 1 and 2, an embodiment of a mounting apparatus 10 for mounting a heat sink 20 to a printed circuit board (PCB) 30 includes a locking pin 11, a spring 12, and a snap ring 13.

The locking pin 11 includes a columnar body 111. A head portion 112 extends from a top portion of the body 111. A curving handle 113 extends out from the head portion 112 of the locking pin 11. A snap ring groove 114 and a locking groove 115 are positioned at a lower portion of the body 111. The snap ring 13 extends inward to form a plurality of contact portions 131 engaging the snap ring groove 114 and fixing the snap ring 13 on the locking pin 11. The spring 12 is fixed between the head portion 112 and the snap ring 13.

The heat sink 20 includes a fan 21 and a plurality of fins 22 attached thereto. Four supporting legs 25 extend from a base of the fins 22. Each supporting leg 25 includes a first mounting hole 23 positioned on a distal end of the supporting leg 25. A pair of second mounting holes 33 and a pair of third mounting holes 35 are positioned on the PCB 30 corresponding to the first mounting holes 23. Each second mounting hole 33 includes a second inserting hole 331 and a second accommodating hole 332 extending from one side thereof along a first axis. A diameter of the second inserting hole 331 exceeds a diameter of the second accommodating hole 332. The third mounting hole 35 includes a third inserting hole 351, and a third accommodating hole 352 extending from one side thereof along a second axis. A diameter of the third inserting hole 351 exceeds a diameter of the third accommodating hole 352. The diameter of the second inserting hole 331 is substantially equal to the diameter of the third inserting hole 351. The diameter of the second accommodating hole 332 is substantially equal to the diameter of the third accommodating hole 352. The first and second axes are different. In this embodiment, the first axis is perpendicular to the second axis. A diameter of the body 111 is less than the diameter of the second and third inserting holes 331, 351, and exceeds the diameter of the second and third accommodating holes 332, 352. A diameter of the first mounting hole 23 exceeds the diameter of the body 111.

Figure 3:
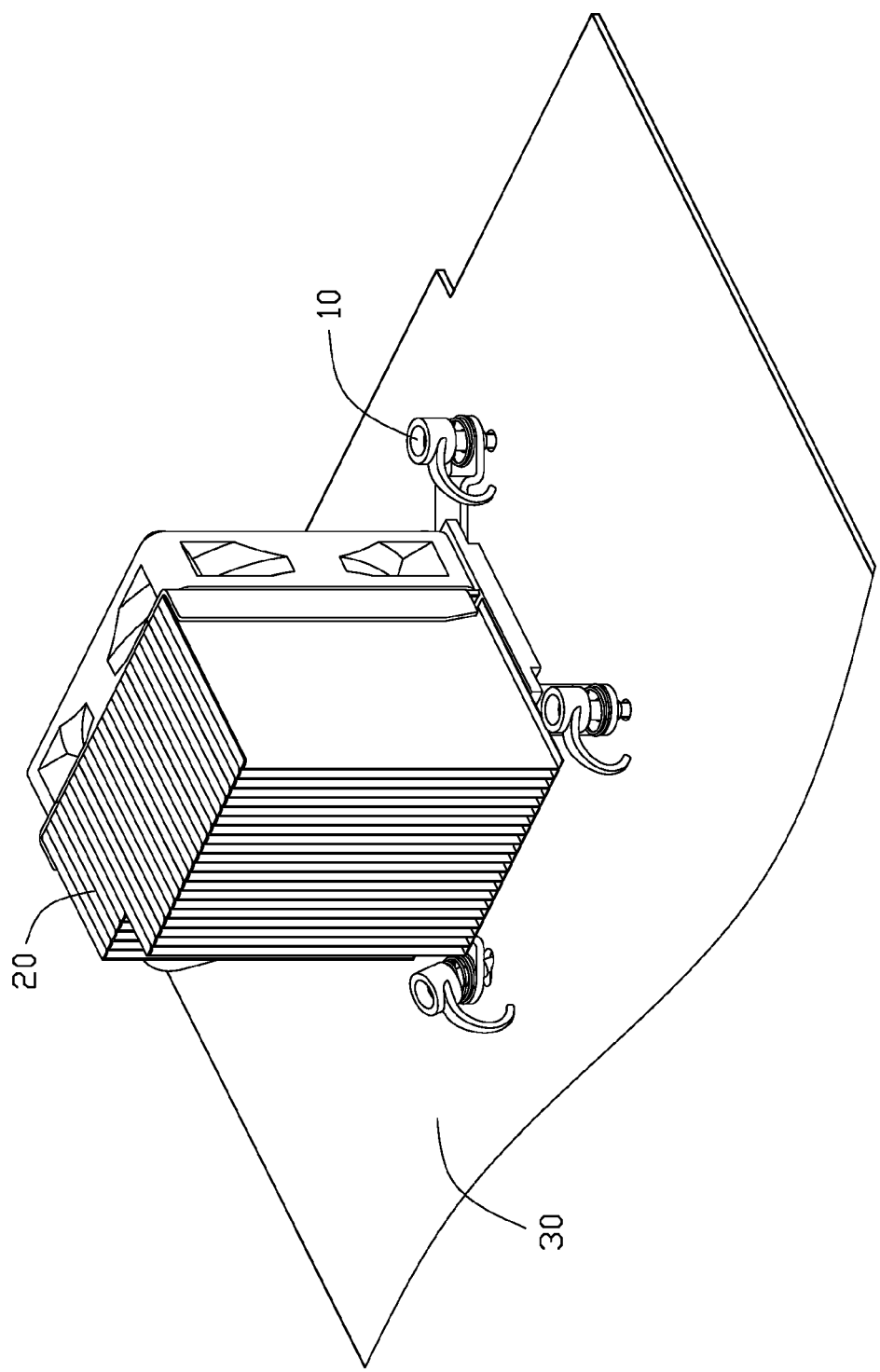
FIG. 3 is an assembled view of the mounting apparatus, the heat sink, and the PCB of FIG. 1 in one state.
Figure 4:
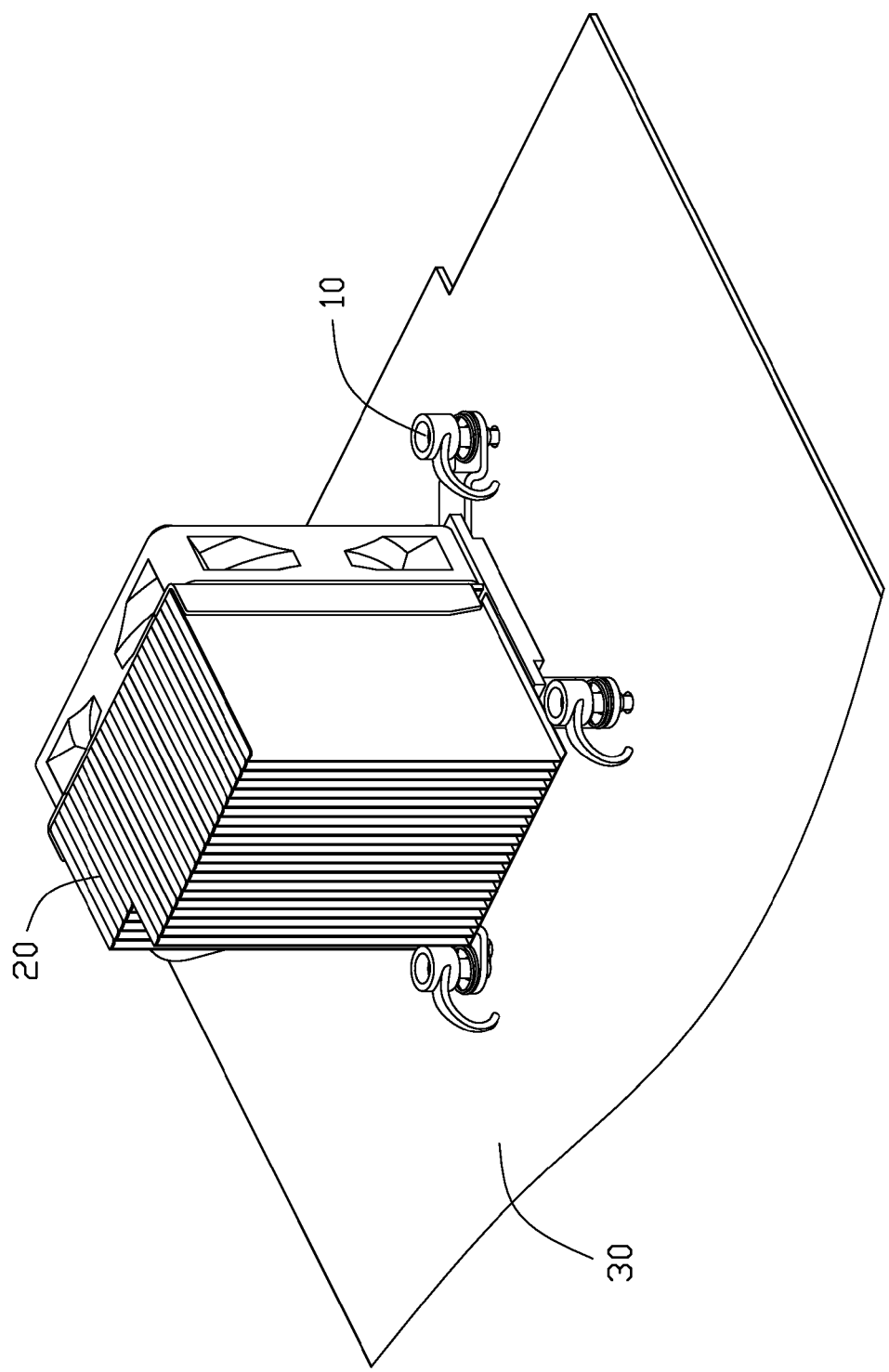
FIG. 4 is an assembled view of the mounting apparatus, the heat sink, and the PCB of FIG. 1 in another state.

Referring to FIGS. 3 and 4, in assembly, the locking pins 11 pass through the springs 12 and the first mounting holes 23 until the snap ring grooves 114 are below the supporting legs 25. The snap rings 13 are fixed on the snap ring grooves 114 to mount the locking pins 11 to the supporting legs 25. Two of the locking pins 11 are inserted into the second inserting holes 331. The heat sink 20 is moved to slide the locking grooves 115 from the second inserting holes 331 to the second accommodating holes 332. The two locking pins 11 are fixed in the second accommodating holes 332. The handles 113 of another two locking pins 11 are then pulled to compress the corresponding springs 12. The two locking pins 11 slightly angle in the first mounting holes 23, and the springs 12 are elastically deformed between the head portions 112 and the supporting legs 25. The angled locking pins 11 are inserted into the third inserting holes 351. When the locking grooves 115 are in the third inserting holes 351, the angled locking pins 11 are released to return to an upright position by elasticity of the springs 12. The locking grooves 115 slide from the third inserting holes 351 to the third accommodating hole 352. The locking pins 11 are fixed in the third accommodating hole 352 and the heat sink 20 is fixed on the PCB 30.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A device comprising: a heat sink with two first mounting holes receiving two mounting apparatuses respectively; and a printed circuit board (PCB) with a surface, a second mounting hole, and a third mounting hole corresponding to the first mounting holes, wherein the second mounting hole comprises a second inserting hole, and a second accommodating hole extending from the second inserting hole along a first axis, the third mounting hole comprises a third inserting hole, and a third accommodating hole extending from the third inserting hole along a second axis, the second axis extends in a different direction then the first axis wherein a first mounting apparatus is inserted into the second inserting hole, and moved along the first axis to be received in the second accommodating hole, and while the first mounting apparatus is received in the second accommodating hole, a second mounting apparatus is angled in a first direction not perpendicular to the surface of the PCB into the third inserting hole, returns to a second direction perpendicular to the surface of PCB, and moves along the second axis to be received in the third accommodating hole.

2. The device of claim 1, wherein a distance between the second accommodating hole and third accommodating hole is substantially equal to that between the two first mounting holes.

3. The device of claim 2, wherein each of the mounting apparatuses comprises a locking pin received in a respective first mounting hole, a snap ring attached to the locking pin, and a spring attached between the locking pin and the snap ring, each of the locking pins comprises a body, a head portion extending from a top portion of the body, a snap ring groove and a locking groove positioned at a lower portion of the body, and each of the bodies passthrough the spring and the respective first mounting hole, each of the snap rings is fixed on a corresponding snap ring groove to position each of the mounting apparatuses in the respective first mounting hole, and the locking groove is received in a corresponding accommodating hole passing through a corresponding inserting hole to fix the heat sink onto the PCB.

4. The device of claim 3, wherein a diameter of the second inserting hole is substantially equal to a diameter of the third inserting hole, and a diameter of the second accommodating hole is substantially equal to a diameter of the third accommodating hole.

5. The device of claim 4, wherein each of the bodies is a circular cylinder, and a curving handle extends out from the head portion of each of the locking pins.

6. The device of claim 5, wherein each of the snap rings extends inward to form a plurality of contact portions engaging the corresponding snap ring groove and fixing each of the snap rings on each of the bodies.

7. The device of claim 6, wherein a diameter of a portion of each of the bodies is less than the diameter of each of the inserting holes, and exceeds the diameter of each of the accommodating holes, a diameter of each of the locking grooves is less than the diameter of each of the accommodating holes, and a diameter of each of the first mounting holes exceeds the diameter of the portion of each of the bodies.

* * * * *